(12) United States Patent　　　　　(10) Patent No.: US 12,575,332 B2
Reznicek et al.　　　　　　　　　　　(45) Date of Patent: Mar. 10, 2026

(54) CoFeB BASED MAGNETIC TUNNEL JUNCTION DEVICE WITH BORON ENCAPSULATION LAYER

(71) Applicants: International Business Machines Corporation, Armonk, NY (US); HeFeChip Corporation Limited, Sai Ying Pun (HK)

(72) Inventors: Alexander Reznicek, Troy, NY (US); Young-Suk Choi, Niskayuna, NY (US); Matthias Georg Gottwald, Ridgefield, CT (US); Daniel P. Morris, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 17/962,496

(22) Filed: Oct. 8, 2022

(65) Prior Publication Data

US 2024/0122076 A1　　Apr. 11, 2024

(51) Int. Cl.
　　*H10N 50/80*　　　(2023.01)
　　*H10B 61/00*　　　(2023.01)
　　*H10N 50/01*　　　(2023.01)
(52) U.S. Cl.
　　CPC ............. *H10N 50/80* (2023.02); *H10B 61/00* (2023.02); *H10N 50/01* (2023.02)
(58) Field of Classification Search
　　CPC ......... H10N 50/80; H10N 50/10; H10B 61/00
　　See application file for complete search history.

(56) References Cited

U.S. PATENT DOCUMENTS 8,482,966 B2　7/2013　Kang et al.
8,716,818 B2　5/2014　Yoshikawa et al.
(Continued)

FOREIGN PATENT DOCUMENTS

WO　　WO2022089953　　5/2022

OTHER PUBLICATIONS

L. H. Long, "The Mechanisms of Thermal Decomposition of Diborane and of Interconversion of the Boranes, A Reinterpretation of the Evidence", J. inorg. nucl. Chem, 1970, vol. 32, pp. 1097 to 1115, Pergamon Press, Department of Chemistry, University of Exeter, Exeter, England (Received Jan. 24, 1969).

*Primary Examiner* — Shih Tsun A Chou
(74) *Attorney, Agent, or Firm* — Aaron N. Pontikos

(57)　　　　　ABSTRACT

One or more magnetic tunneling junction (MTJ) pillars are disposed on a substrate. The pillars have one or more magnetic reference layers and one or more magnetic free layers. The magnetic free layers have one or more external surfaces and are made of a magnetic free layer material containing atomic percentage amount of boron. A boron-containing encapsulation layer encapsulates the MTJ pillar(s) and is in direct contact with the magnetic free layer external surfaces. The boron-containing encapsulation layer contains an atomic percentage amount of boron greater than the magnetic free layer atomic percentage amount of boron. Embodiments of the boron-containing encapsulation layer contain at least 95 percent pure boron and are between 1 and 3 nanometers thick. Accordingly, the boron-containing encapsulation layer controls and limits the amount of boron diffusing out of the magnetic free layer across a boron diffusion interface formed between the magnetic free layer external surfaces and the boron-containing encapsulation layer. Alternative embodiments of boron-containing encap- (Continued)

sulation layers and methods of making MTJ devices are disclosed.

26 Claims, 12 Drawing Sheets

(56)                    References Cited

U.S. PATENT DOCUMENTS

| | | | |
|---|---|---|---|
| 9,847,412 B2 | 12/2017 | Derluyn et al. | |
| 9,853,210 B2 | 12/2017 | Annunziata et al. | |
| 9,935,261 B1 | 4/2018 | Patel et al. | |
| 10,439,132 B2 | 10/2019 | Iwata et al. | |
| 2010/0102407 A1* | 4/2010 | Kajiyama ............. | H10B 61/22 |
| | | | 257/E29.323 |
| 2017/0263861 A1* | 9/2017 | Park ...................... | H10N 50/01 |
| 2018/0269385 A1* | 9/2018 | Iwata ................... | G01R 33/098 |
| 2018/0301266 A1 | 10/2018 | Ou et al. | |
| 2020/0152860 A1 | 5/2020 | van der Straten | |
| 2020/0259071 A1 | 8/2020 | Worledge et al. | |
| 2021/0175284 A1* | 6/2021 | Ouellette ............. | H01F 41/303 |
| 2022/0165936 A1* | 5/2022 | Shen ..................... | H10N 50/01 |

* cited by examiner

300

314

215, 315

314

210, 310

350

250

215, 315

210, 310

350

175
150
160
150
140
130
125
120
125-2
120-2
125-1
120-1

110

105

800

Build MTJ Stack Structure
1005

Form One or More MTJ Pillars
1010

Encapsulate MTJ Pillar Sides with Boron-Containing Layer: a. Boron-Containing Dielectric Spacer or b. Boron layer Covered by Dielectric Spacer
1015

Continue Processes, Form Circuits, and Connections
1020

1000

CoFeB BASED MAGNETIC TUNNEL JUNCTION DEVICE WITH BORON ENCAPSULATION LAYER

BACKGROUND

The present invention relates to Magnetic Tunnel Junction (MTJ) devices and methods of making these devices. More specifically, the invention relates to MTJ devices and methods of making MTJ devices with engineered magnetic moments, $M_{st}$, and coercivity, $H_c$, achieved by controlling boron content within layers (particularly a magnetic free layer) of MTJ pillars in the MTJ device.

MTJ device pillars are used in MTJ devices like Magnetic Random-Access Memories (MRAM) as well as in other MTJ devices. MRAM is a non-volatile random access memory technology in which data is stored using magnetic storage elements in the MTJ pillars. MRAM is a viable memory option for stand-alone and embedded applications, for example, the internet of things (IoT), automobiles, or artificial intelligence (AI).

MTJs are generally formed from two ferromagnetic layers, each of which can hold a magnetization. The layers are separated by a thin dielectric layer, i.e., the tunnel barrier layer. It is known that when MTJs are used as memory devices or sensors, the magnetization of one of the layers is supposed to be unchanged during operation (so called reference layer) while magnetization orientation of the other layer may be modified during operation (so called free layer). In general, the orientation of the reference layer is set during an initiation process of the magnetic tunnel junction device, for example by exposure to a strong external magnetic field or in some cases by exposure to a strong magnetic field combined with heat under ultra-high vacuum (strong magnetic field: >0.1 Tesla, in most MRAM cases probably >1.5 Tesla; heat: >200C, but less than 550C; and ultra-high vacuum: <$10^{-5}$ Torr).

In more specific embodiments, a magnetic tunnel junction (MTJ) device is a small dimensional MTJ pillar (diameter 5-150 nanometers (nm), most likely 20-100 nm) composed of a magnetic reference layer, a magnetic free layer, and a thin tunnel barrier layer separating the magnetic reference layer and free layer.

A particular use case for MTJ devices is their implementation as physical bits of a magnetic random-access memory. Thereby, a "0" and "1" are encoded as parallel and antiparallel magnetization states of free layer and reference layer. A small sensing voltage applied to the ends of the pillar MTJ device allows measuring its resistance. The tunneling magnetoresistance effect (TMR) provides the resistance difference between parallel and antiparallel orientation of the free and reference layer of a bit of the memory.

Different methods of writing the bit exist for different memory designs. One method can be the use of a write current flowing through the MTJ pillar generating a so-called spin transfer torque. The direction of this write current with respect to the pillar geometry determines if a "0" or a "1" is written through reorientation of the free layer magnetization. By direction of the write current with respect to the pillar geometry it is meant whether the voltage across the dielectric barrier of the MTJ pilar is positive or negative.

Typical MTJ stacks have a reference layer consisting of cobalt-platinum (Co|Pt) or cobalt-palladium (Co|Pd) based layers combined with a cobalt-iron-boron alloy (CoFeB) layer. Thereby the CoFeB layer is in direct contact with a magnesium oxide (MgO) tunnel barrier. The free layer typically consists of a combination of CoFeB and CoFe alloys combined with refractive metals layers like tantalum (Ta), tungsten (W), niobium (Nb), zirkonium (Zr), or others.

The free layer may be in contact with another oxide, e.g., MgO, at the interface that is not in contact with the MgO barrier.

MTJ pillar structures are usually formed by patterning and etching a blanket film of MTJ layers, where the blanket film of MTJ layers is in the form of a MTJ stacked structure. In some embodiments, the MTJ stacked structure is etched, e.g., by an ion beam etch (IBE) to form single MTJ pillars or arrays of one or more MTJ pillars. Devices, e.g., MRAMs and other devices, can be made by connecting device components (like transistors, etc.) in back-end-of-the-line (BEOL) levels to the MTJ pillars. These structures and methods of making these structures are known.

During processing an MRAM containing chip, the blanket film layers as well as the already patterned pillars may be exposed to thermal budgets. One example might be an anneal to cure a dielectric material in a back end of the line (BEOL) process step. During these BEOL processing anneals, boron can diffuse out of CoFeB layers. For etched pillars, two paths of boron diffusion are possible: either into adjacent layers and/or into the layers encapsulating the pillar. Improper amounts of boron (e.g., too little boron) in the magnetic free layer can adversely affect the potential retention time of information stored in the bit and or make the information more sensitive to perturbance by external magnetic fields. One measure of decreased retention is a reduction of the coercive field Hc. The coercive field designates the magnetic field needed to reverse the magnetization of a magnetic bit at a typical timescale of milliseconds to seconds.

He is the field needed to apply perpendicular to the film planes of a magnetic stack to reverse the magnetic moment of a pillar. Hk is the magnetic field needed to apply parallel to the film stack planes to align the magnetic moment parallel to the film stack planes of the magnetic stack. Insufficient boron in the magnetic free layer(s) after anneals can lead free layer(s) to become non-homogenous and accumulate CoFe grains. Therefore, insufficient boron after anneal in the magnetic free layer(s) lowers Hc and $H_K$ of the free layer(s) significantly and leads to poor retention of the stored information of the bit/MRAM.

One remedy to assure sufficient boron content after thermal exposure is to deposit layers with excessive boron composition than required. The preferred method of deposition is physical vapor deposition (PVD), e.g., by sputtering. It is then possible to secure the required boron content in the magnetic layer after boron diffusion out during thermal anneal process. However, using these high amounts of boron make the sputtering targets brittle, leading to foreign material/particles (FM) added onto the wafer surface during deposition, and therefore leading to poor manufacturing yields. Note that these foreign materials (FM) can be on the order of micrometers in size while the magnetic layer being contaminated by the FM is on the order of nanometers in thickness.

Further, an example brittle CoFeB sputter target, with a high boron content, e.g., greater than 25%, not only leads to higher particle (FM) counts to dispose onto the MTJ substrate wafer but also causes more source particles (FM) to enter the chamber resulting in decreased mean-time-between-maintenance of the PVD system.

In addition, the a forementioned thermal processing steps lead to crystallization of the CoFeB alloy. Upon crystallization of CoFeB with insufficient boron content, large grains form in the magnetic free layer and the statistical distributions of properties like Hc will widen (increase the standard deviation) because the number of grains per device shrinks. Note that the statistical distribution of properties is approximately equal to 1/sqrt(N), where N is the number of grains in the magnetic free layer. Accordingly, the more and smaller the grains in the magnetic free layer, the smaller the standard deviation around a mean value of properties like Hk in the magnetic free layer.

There is a need to improve the control of boron content, e.g., boron diffusion, concentration, and concentration uniformity during manufacturing of pillars and MTJ devices. Among other needed improvements, controlling boron inter-diffusion of MRAM devices helps limit the trade-off between high boron content source use vs lower memory retention and improved statistical distribution of key parameters.

SUMMARY

Embodiments of the present invention include a magnetic tunneling junction (MTJ) pillar with one or more MTJ pillar surfaces/sidewalls. Devices using MTJ pillars are also disclosed. The MTJ pillar comprises a substrate on which the MTJ pillar is disposed. The MTJ pillar and the MTJ pillar surfaces/sidewalls are perpendicular to the substrate.

The pillar has one or more magnetic reference layers, which are disposed on the substrate, one or more magnetic free layers, a tunnel barrier, and a boron-containing encapsulation layer. Other layers or structures, like back-end-of-the-line (BEOL) structures/layers, can be located between the magnetic reference layers and the substrate.

The magnetic reference layers have a first magnetic orientation. The first magnetic orientation is generally in a fixed magnetic orientation.

In some embodiments, the magnetic free layer(s) can be grown from multiple (e.g., 1-20) sub-process steps, typically represented as sub-layers. Also, a number of sublayers higher than 20 is conceivable. One example of these sublayer structures for the free layer is 0.6-1.2 nm of deposition from a $Co_{20}Fe_{60}B_{20}$ target and then a second layer of 0.2-1.2 nm of deposition form a pure Fe target.

The magnetic free layer has a second magnetic orientation. The second magnetic orientation is switchable to be either in a parallel or anti-parallel alignment with the first magnetic orientation. The magnetic free layers each have two internal surfaces that are within the MTJ pillar. Further, the magnetic free layers each have one or more magnetic free layer external surfaces. The magnetic free layer external surfaces are colinear with the MTJ pillar surfaces/sidewalls.

The tunnel barrier layer, with a tunnel barrier layer thickness, is sandwiched between and separates the magnetic reference layer and the magnetic free layer. Current tunnels through the tunnel barrier layer when flowing between the magnetic reference layers and the magnetic free layers. When the magnetic reference layers and the magnetic free layers are in parallel alignment, the device is in a low resistance state. When the magnetic reference layers and the magnetic free layers are in anti-parallel alignment, the device is in a high resistance state.

The boron-containing encapsulation layer encapsulates the MTJ pillar and is in direct contact with the magnetic free layer, e.g., the magnetic free layer external surfaces. The boron-containing encapsulation layer contains an atomic percentage amount of boron greater than that of the magnetic free layer. Accordingly, the boron-containing encapsulation layer controls and limits the amount of boron diffusing out of the magnetic free layer across the interface formed between the boron-containing encapsulation layer and the magnetic free layer.

Alternative embodiments of boron-containing encapsulation layers and methods of making MTJ devices are disclosed. Embodiments of the boron-containing encapsulation layer include: 1. a boron-containing dielectric encapsulation layer and 2. a preferred substantially pure boron encapsulation layer (with variations of "pure" boron). In some embodiments, the boron-containing encapsulation layer contains least 99 percent boron and is between 1 and 3 nanometers thick.

BRIEF DESCRIPTION OF THE DRAWINGS

Various embodiments of the present invention will be described below in more detail, with reference to the accompanying drawings, now briefly described. The figures show various apparatus, structures, and related method steps of the present invention.

DETAILED DESCRIPTION

Figure 1:
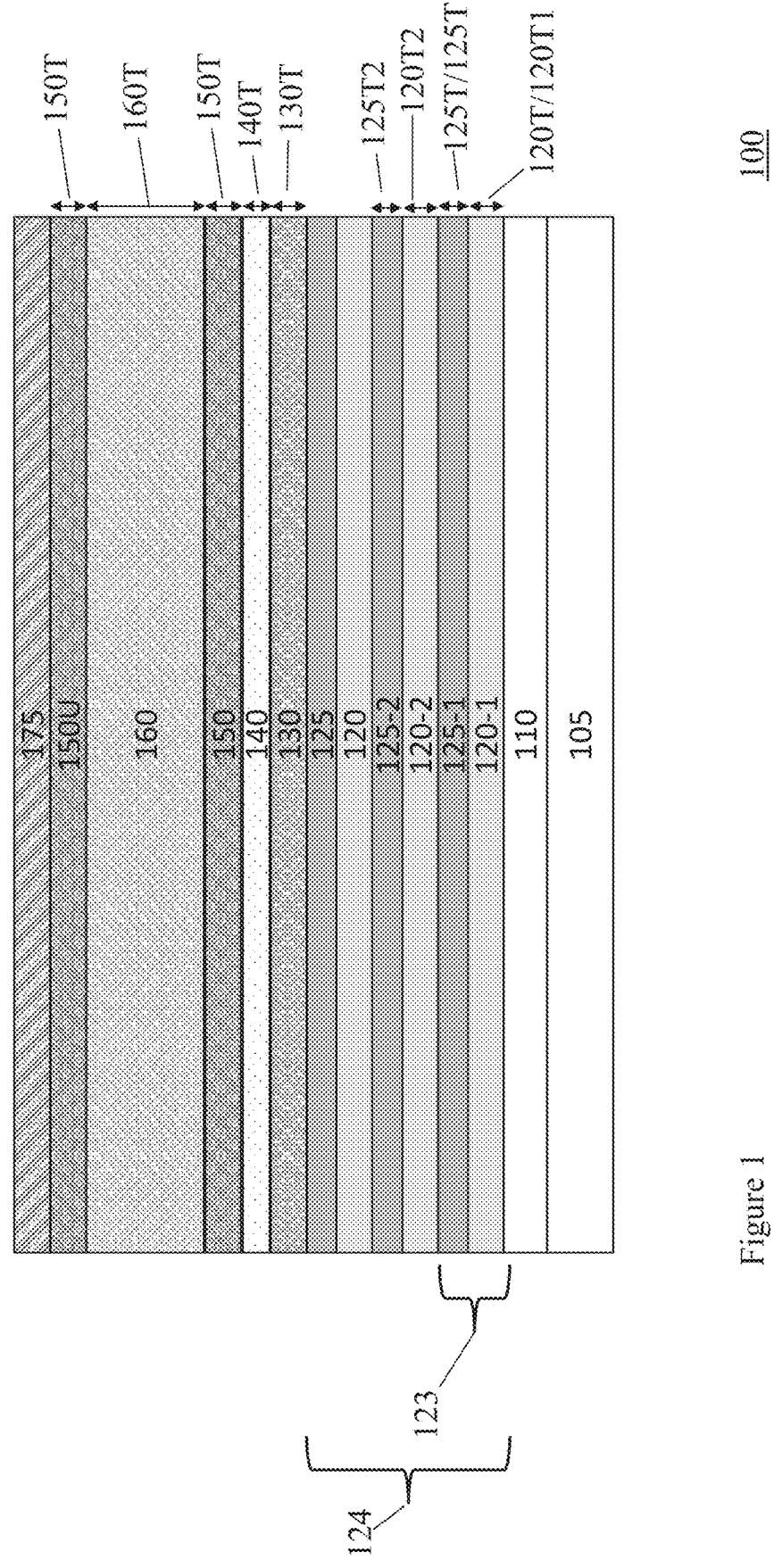
FIG. 1 is a cross-sectional view of a non-limiting example of an interim magnetic tunnel junction (MTJ) stacked structure.

It is to be understood that embodiments of the present invention are not limited to the illustrative methods, apparatus, structures, systems, and devices disclosed herein but instead are more broadly applicable to other alternative and broader methods, apparatus, structures, systems, and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," "sidewalls", and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

A magnetic tunnel junction (MTJ) has two magnetic, electrically conductive, metal layers separated by a thin layer of insulator, a tunnel barrier layer. The tunnel barrier layer is thin enough so that electrons can tunnel through the tunnel barrier if a bias voltage is applied between two metal electrodes or connections attached to the respective magnetic metal layers. In some embodiments, the bias voltage is applied through connections in a BEOL layer.

In MTJs, the tunneling current depends on the relative orientation of the magnetization of the two magnetic layers. When the magnetic layers are magnetized in the same direction, i.e., in parallel alignment or parallel orientation, more tunneling current flows, therefore the resistance of the device decreases, and the device is in a low resistance state. On the other hand, when the magnetic layers are magnetized in opposite directions/orientation, i.e., in antiparallel magnetization or antiparallel orientation, less tunneling current flows, therefore the resistance of the device increases, and the device is in a high resistance state.

In some embodiments, one of the magnetic layers acts as a "fixed layer" or "reference layer", whose magnetization direction is fixed to a given direction. Alternatively, the other magnetic layer acts a "free layer", whose magnetization changes its direction relatively easy to the "fixed" or "reference" layer. Based on the relative orientation of free layer with respect to reference layer, the device is switched from parallel alignment to antiparallel alignment and visa-versa. As a result, the resistance of the device is switched from a high resistance state to a low resistance state and visa-versa.

During operation of the device in some embodiments, a switching current with a current magnitude above a switching magnitude threshold is used to switch the magnetization orientations of the magnetic free layer. For example, a switching current above a switching magnitude threshold from the reference layer to the free layer switches the magnetization direction of the free layer parallel to the reference layer. Alternatively, a switching current above a switching magnitude threshold from the free layer to the reference layer switches the magnetization direction of the free layer antiparallel to the reference layer. In this manner, the magnetization direction of the magnetic free layer can be switched from parallel to antiparallel alignment, and visa-versa, with respect to the magnetization direction of the magnetic fixed layer. A sensing current, with lower magnitude, passed through the device in either direction will sense whether the device is in a low or high resistance state.

It is noted that in some embodiments, the magnetic fixed and/or reference layer can be formed in one or more magnetic layers.

FIG. 1 is a cross-sectional view of an interim magnetic tunnel junction (MTJ) stacked structure 100 built on a substrate 105.

The substrate 105 for these devices are well known and varied. As non-limiting examples, substrates 105 can be as simple as a simple as a single dielectric layer (e.g., with a dielectric constant of about 4.0 or less) or as complex as known back end of the line (BEOL) and/or front end of the line (FEOL) circuitry. General alternative substrates 105 are known in the art and are envisioned.

In some embodiments, the back end of the line BEOL and FEOL layer or structure 110 is disposed on the substrate 105 and includes a well-known plurality of layers formed by well-known BEOL/FEOL processes performed in semiconductor technologies. The BEOL/FEOL layer typically contains regions of interconnects, metallization, insulation, etc. both within layers and between layers, as well as individual auxiliary devices (e.g., capacitors, resistors, etc.). As is well known, BEOL/FEOL "layers" have a form that is different than the layers referred to in the other "layers" in the stacked structure 100 and one skilled in the art would know how to distinguish "layers" in the BEOL/FEOL from other layers of the stacked structure 100, based on the context of the description. Layers in the BEOL/FEOL 110 will be referred to as a BEOL and/or FEOL layer 110 individually (or in aggregate as BEOL or FEOL 110 or the FEOL/BEOL layer 110) without further distinction thought necessary.

In some embodiments, some MRAM circuitry (see MTJ pillar 250 below) is formed in the FEOL 110 and then connected by interconnect structures in the BEOL 110 to complete formation of MRAM devices.

In some embodiments there is a single layer of ferromagnetic material 125 disposed on the FEOL/BEOL layer 110. This layer of ferromagnetic material 125 is a magnetic reference layer 125 and is set to one magnetic polarity or orientation. In some embodiments, the reference layer 125 is a permanent magnet 125 or other fixed magnetic material. For example, the reference layer 125 may be composed of one or more metals or metal alloys exhibiting high spin polarization. Non-limiting examples of reference layer 125 metals and/or metal in alloys include: iron (Fe), nickel (Ni), cobalt (Co), chromium (Cr), boron (B), or manganese (Mn).

In alternative embodiments, the magnetic reference layer 125 is formed as a multilayer arrangement 123 having (1) a high spin polarization region formed from of a metal and/or metal alloy using the metals mentioned above 125/125-1, and (2) a region constructed of a material or materials that exhibit strong perpendicular magnetic anisotropy (strong PMA) 120/120-1. In some embodiments, the multilayer arrangement 123 is one pair of a single ferromagnetic material layer or high spin polarization layer 125 and a single PMA layer 120. In other embodiments, there are multiple pairs 124 of a high spin polarization layer 125-1 and a PMA layer 120-1 in the multilayer arrangement 124 of the magnetic reference layer 124. Exemplary materials with strong PMA 120/120-1 that may be used include metals such as cobalt, nickel, platinum, palladium, iridium, or ruthenium, and include these metals arranged as alternating layers. The strong PMA regions/layers may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium.

Again, the alloys may be arranged as alternating layers as shown in region 123 or in alternating layers 120/125 above region 123. In some embodiment, combinations of these materials and regions may also be employed. In these instances, the combination of layers 124 functions as the magnetic fixed layer 124 or magnetic reference layer 124. All of these embodiments and their combinations are envisioned.

The thickness of magnetic reference layer (125, 120/125, 123, 124) will depend on the material selected. Example thicknesses 125T-1 of a high spin polarization layer 125-1 and example thicknesses 120T1 of PMA layer 120-1 range between from 0.3 nanometers (nm) to 3 nm. However, other thicknesses are envisioned and the thicknesses (120T, 120T1, 125T, 125T1, etc.) depend on the material selected.

In some embodiments the magnetic reference layer 124 comprises a series of alternating layers 123 of a platinum (Pt) PMA layer 120 (120-1) and cobalt (Co) layers 125 (125-1) making up the magnetic reference layer 124 which is disposed on the BEOL layer 110.

In some embodiments, having multiple layers in the reference layer 123/124 make the reference layer 123/124 more stable and reliable. Different configurations of reference layers 123/124 are known and envisioned as embodiments of this invention.

In alternative embodiments, only the polarization enhancing layer 140 (described below) has a high spin polarization.

The reference layer(s) 123/124 are deposited by known techniques, e.g., physical vapor deposition (PVD), using known tools like a PVD cluster tool. Typically, multiple layers can be deposited using the same tool by using sub chambers to avoid breaking vacuum, as is well known.

In some embodiments, a non-magnetic spacer metal layer 130 is deposited on the reference layer(s) 123/124, e.g., using the PVD method described above. In some embodiments, the non-magnetic spacer metal layer 130 is made tantalum, tungsten or other refractory metals and has a thickness 130T between 0.1 nanometers (nm) and 0.4 nm. Some embodiments omit this layer 130. All alternative embodiments of the non-magnetic metal layer 130 are envisioned.

In some embodiments, a polarization enhancing layer 140 is deposited on the non-magnetic spacer metal layer 130 using known techniques, e.g., PVD using the PVD cluster tool described above. In some embodiments, the polarization enhancing layer 140 is made of CoFeB or bilayer of CoFeB|Fe, with a total thickness 140T between 0.5 nm to 1.5 nm. In some embodiments, the polarization enhancing layer 140 has a thickness 140T of about 1 nm.

The tunnel barrier layer 150 is made of an insulator material and is formed at such a thickness as to provide an appropriate tunneling resistance. Exemplary materials for the tunnel barrier layer 150 include magnesium oxide (MgO), aluminum oxide ($Al_2O_3$), titanium oxide ($TiO_2$), or materials of higher electrical tunnel conductance, such as semiconductors or low-bandgap insulators. The thickness 150T of the tunnel barrier layer 150 will depend on the material selected. In one example, the tunnel barrier layer 150 may have a thickness 150T from 0.5 nm to 1.5 nm. The tunnel barrier layer 150 is deposited by known techniques including atomic layer deposition (ALD), physical vapor deposition (PVD), and chemical vapor deposition (CVD).

A magnetic free layer 160 is deposited on the tunnel barrier layer 150 thereby sandwiching the tunnel barrier layer 150 between the magnetic reference layer, typically 124, and the magnetic free layer 160. The magnetic free layer 160 material is a magnetic material (or a stack of magnetic materials) with a magnetization that can be changed in an orientation relative to the magnetization orientation of the magnetic material in the magnetic reference layer, 124 typically. Exemplary magnetic materials (magnetic free layer materials) making magnetic free layer 160 include alloys and/or multilayers of cobalt, iron, alloys of cobalt-iron, nickel, alloys of nickel-iron, and alloys of cobalt-iron-boron. Embodiments of the magnetic free layer 160 are made from cobalt-iron-boron (CoFeB) alloys.

In some embodiments, the magnetic free layer 160 is made of CoFeB alloys with or without insertions of metals like zirconium (Zr) and titanium (Ti) and including refractory metals like tantalum (Ta), tungsten (W), molybdenum (Mo), and niobium (Nb). The free layer 160 can be grown by depositing multiple sub-layers of CoFeB, Ta, W, Mo, etc. with different thicknesses and compositions.

In some embodiments, the atomic percentage of boron in CoFeB targets/layers 160 is between 1-90% for cobalt (Co) or iron (Fe) and 1-60% for boron. A typical free layer 160 might comprise a CoFeB layer of about 1 nm in thickness with about 25% (atomic percent) of boron, before annealing, and 0.7 nm of pure Fe with an insertion of 0.2-0.4 nm of a refractory metal like tantalum (Ta) or tungsten (W) in between the CoFeB layer and the iron (Fe) layer.

In some embodiments, the magnetic free layer 160 thickness 160T is between 2 nm to 2.5 nm and is deposited by known techniques, e.g., as described above-PVD with a cluster deposition tool.

In some embodiments, an upper MgO layer 150U is deposited on the magnetic free layer 160 using the techniques and equipment described above. The upper layer 150U, e.g., MgO layer 150U, is made of a material (typically MgO) with a thickness 150T that adds no (or negligible series resistance) through the stacked structure 100.

A capping layer 175 is deposited as a final layer of the MTJ stacked structure 100. In some embodiments, the capping layer is made of a conductive metal that is used as an electrical contact/electrode for the device. Example, metals for the capping layer 175 include tantalum (Ta), titanium (Ti), tantalum nitride (TaN), titanium nitride (TiN), ruthenium (Ru), tungsten (W), or any combination thereof. The capping layer 175 is deposited using known deposition techniques including PVD (e.g., as above), CVD, ALD, and sputtering. Various thicknesses are envisioned for the capping layer 175. In some embodiments, the capping layer 175 thickness is between 20 nm and 100 nm.

The capping layer 175 is used as an electrical connection for the device. In some embodiments, other electrical connections are made through the BEOL layer 110.

Figure 2:
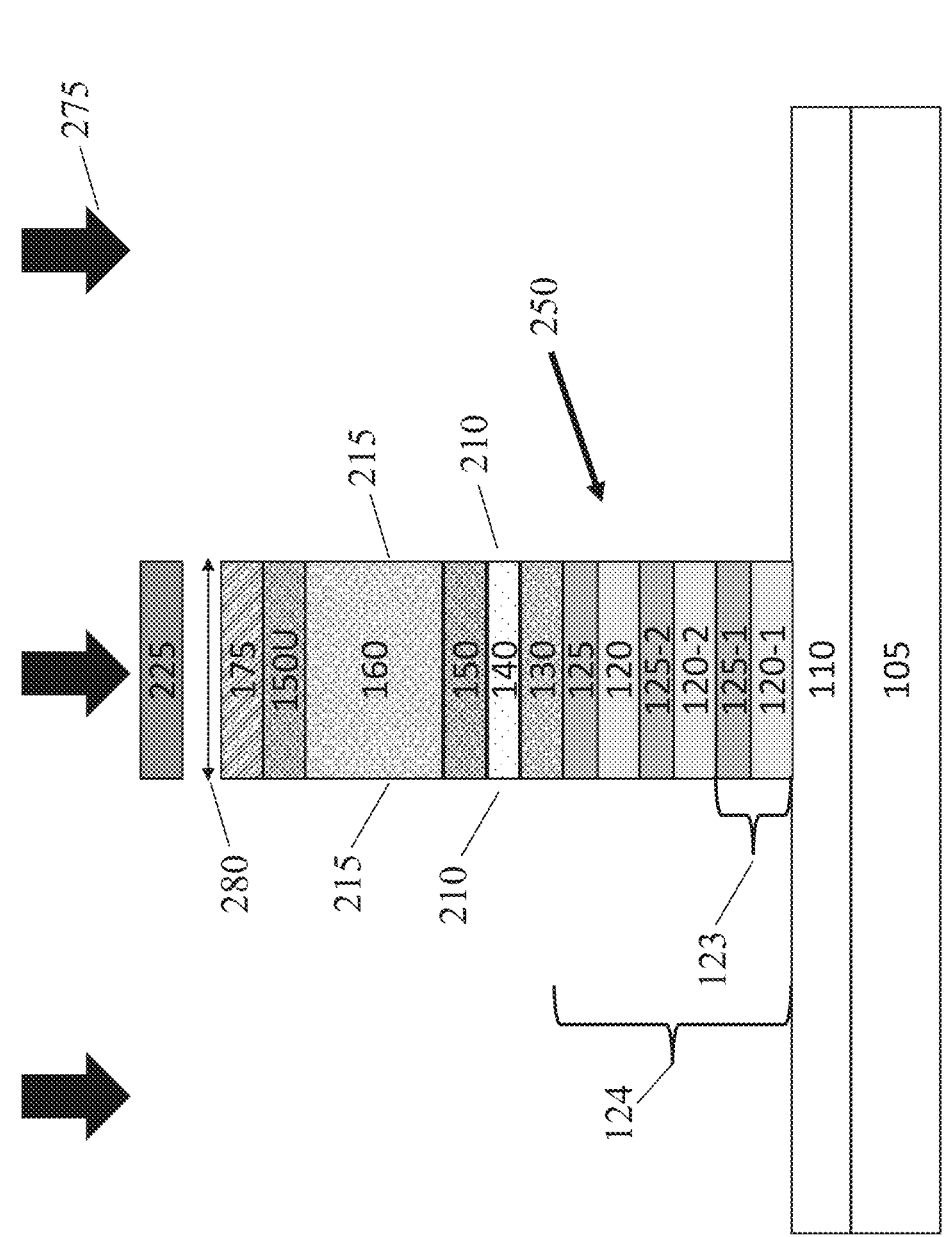
FIG. 2 is a cross-sectional view of an example MTJ pillar with MTJ pillar surfaces that include MTJ pillar free layer surfaces.

FIG. 2 is a cross-sectional view of a MTJ pillar 200/250 with MTJ pillar surfaces 210 that include MTJ pillar magnetic free layer 160 (external) surfaces 215.

A MTJ pillar 250 or arrays of two or more MTJ pillars 250 are created from one or more MTJ stack structures by performing a generally known masked 225 etching 275 process like ion beam etching (IBE). As is known, a hard mask 225 for IBE is used and is made of a sufficiently strong material for IBE patterning. The hard mask can be made of materials like tantalum (Ta) or tantalum nitride (TaN).

In some embodiments, the etching 275 is ion beam etching (IBE). The IBE is time controlled to stop once the surface of the BEOL layer 110 is reached by known techniques and creates MTJ pillars 250 in shapes and locations defined by the mask(s) 225. The widths 280 of the MTJ pillars 250 is in the range of 20 to 100 nm.

After the pillars 250 are formed, the mask(s) 225 are processed by known methods.

Once created by the etch 275, the MTJ pillars 200/250 each have an outermost sidewall or surface 210 that is vertical (e.g., perpendicular to the FEOL/BEOL layer 110 and substrate 105). Further, each of the layers (160, 150, 125, etc.) in the MTJ pillar 200/250 has sidewalls/external surfaces aligned and co-linear with the MTJ pillar sidewalls 210. Specifically, the magnetic free layer 160 has magnetic free layer 160 (external) surfaces 215 that are vertical and colinear with the MTJ pillar surfaces 210.

Figure 3:
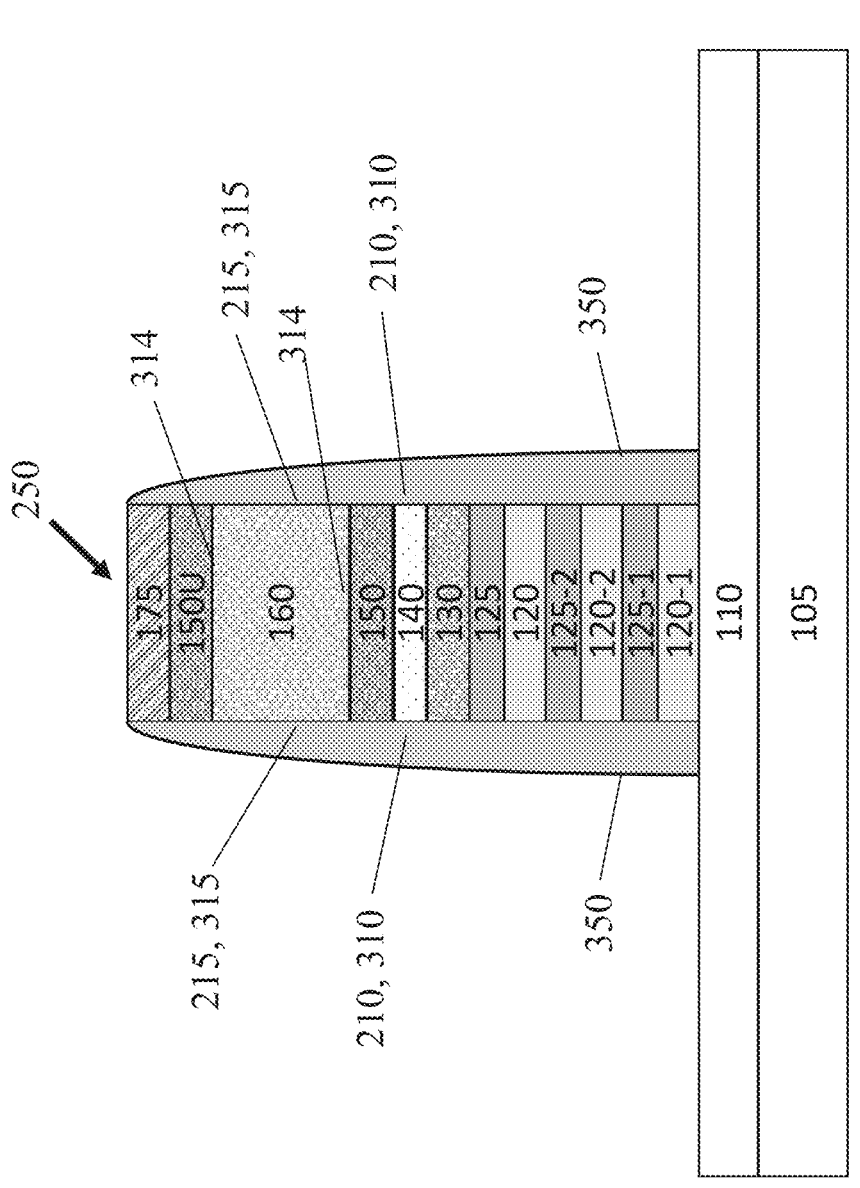
FIG. 3 is a cross-sectional view of one embodiment of a MTJ pillar encapsulated by a boron-containing encapsulation layer (a boron-containing dielectric encapsulation layer embodiment), where in this embodiment the boron-containing dielectric encapsulation layer controls, limits, reduces, and/or prevents boron diffusion from the MTJ pillar surfaces, and particularly from the MTJ pillar free layer surfaces.

FIG. 3 is a cross-sectional view of one embodiment of a MTJ pillar 250 encapsulated by a boron-containing encapsulation layer 350 (a boron-containing dielectric encapsulation layer embodiment 350), where in this embodiment the boron-containing dielectric encapsulation layer 350 becomes a boron diffusion interface, that controls, limits, reduces, and/or prevents boron diffusion from the MTJ pillar surfaces 210/215, and particularly from the MTJ pillar magnetic free layer 160 external surfaces 215.

FIG. 3 shows one class of embodiments of the invention of a boron-containing encapsulation layer 350 encapsulating a MTJ pillar 250 as a boron diffusion interface to limit, reduce, control, and/or prevent boron diffusion from the magnetic free layer 160 external surfaces 215 in the MTJ pillar 250. Generally, encapsulation means forming a boron-containing layer 350 in direct proximity to one or more magnetic free layer 160 external surfaces 215 so that a boron diffusion interface 315 is created with a boron concentration difference at the magnetic free layer 160 external surfaces 215.

Figure 5:
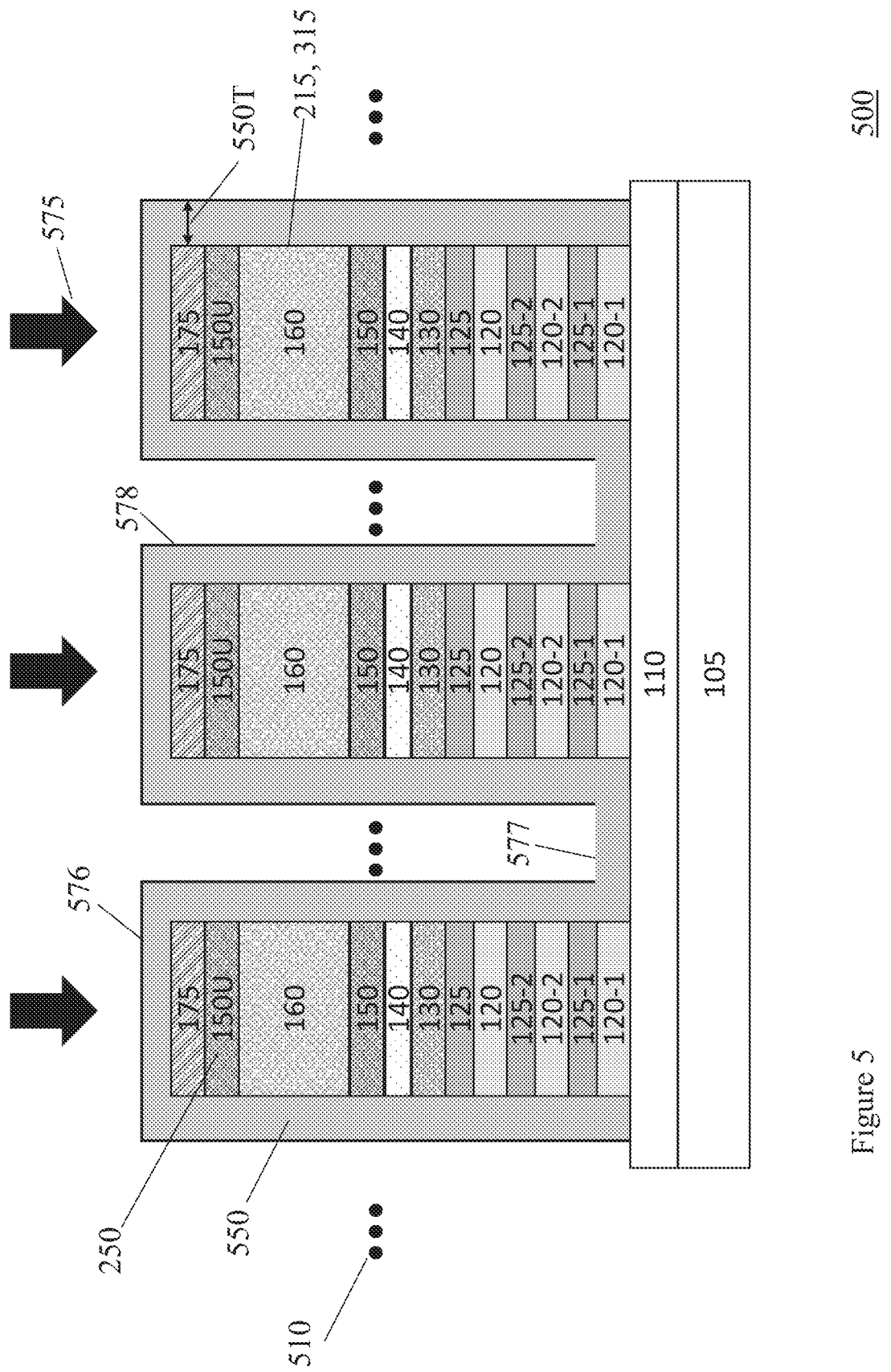
FIG. 5 is a cross-sectional view of an interim structure for forming a boron-containing encapsulation layer encapsulating each of a plurality of MTJ pillars in an array of MTJ pillars on a substrate.
Figure 6:
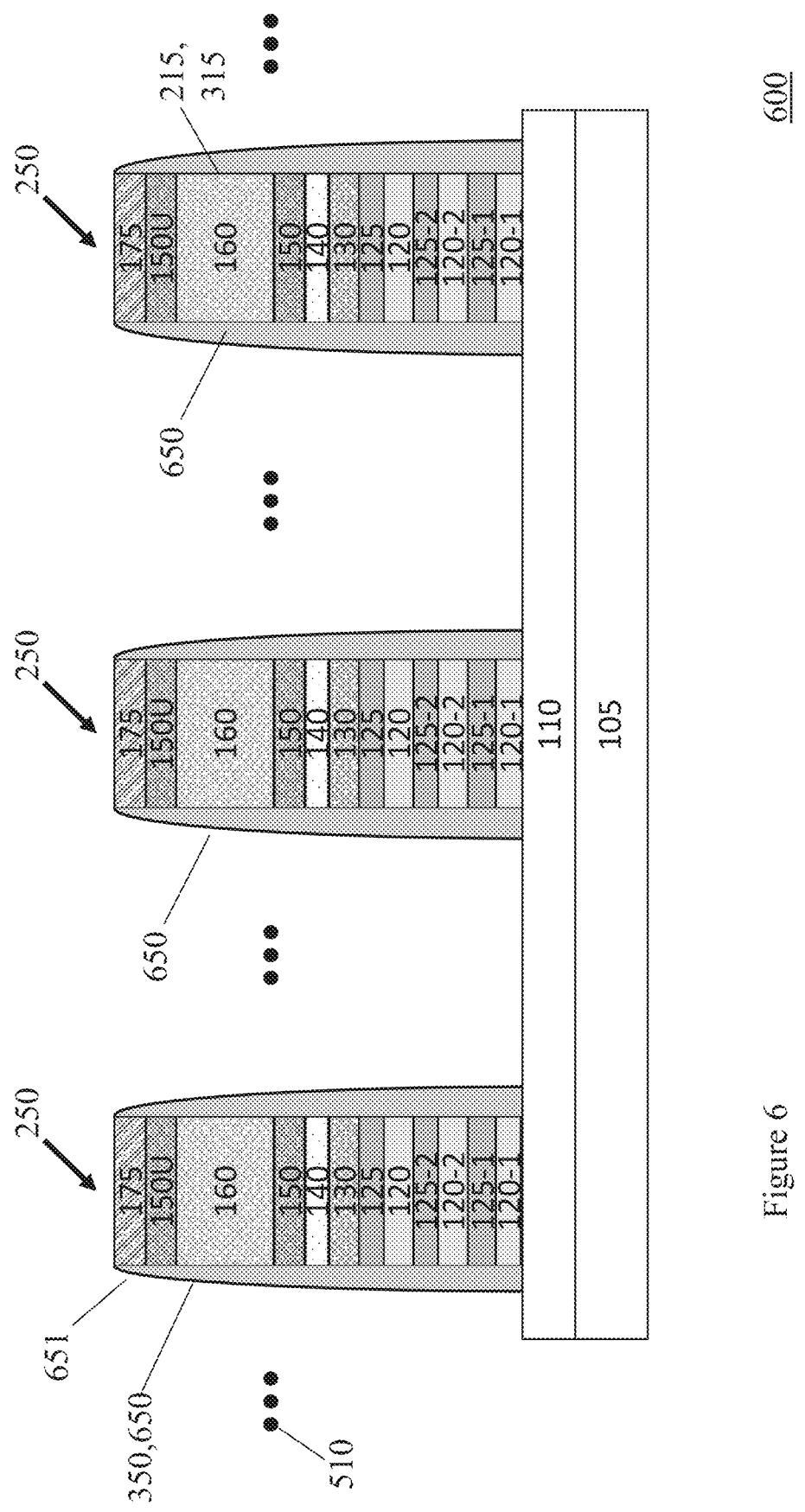
FIG. 6 is cross-sectional view of an array of MTJ pillars each encompassed by a boron-containing encapsulation layer being a boron-containing dielectric encapsulation layer embodiment.

The boron-containing layer 350 is formed by known methods like chemical vapor deposition (CVD) followed by a known directional etch, like a reactive ion etch (RIE). The RIE selectively removes deposited material that is on the horizontal surfaces. Minimal material is removed from the boron-containing layer 350 on the vertical surfaces. The description of FIGS. 5 and 6 provide more detail about processes for forming boron-containing dielectric layers 350.

In preferred embodiments, all external surfaces 215 are encapsulated.

On the other hand, the magnetic free layer 160 also has internal sides or interfaces 314. The internal interfaces 314 are sides of the magnetic free layer 160 that are entirely within the MTJ pillar 250. Typically, the internal interfaces 314 are top and bottom sides of the magnetic free layer 160. The internal interfaces 314, e.g., the top internal side or the bottom internal interface 314, typically are in direct contact with surfaces of internal MTJ pillar 250 layers, like the surface of the tunnel barrier layer 150 or the surface of the capping layer 175. The internal interface 314 are perpendicular to the surfaces 210 of the MTJ pillar 250 and do not have an interface with boron-containing encapsulation layer 350.

The invention limits, reduces, controls, and/or prevents boron diffusion from the magnetic free layer 160 external surfaces 215 in the MTJ pillar 250 by maintaining a high boron concentration in the encapsulation layer 350 on a side of the boron diffusion interface 315 opposite the magnetic free layer 160 surfaces 215, i.e., outside the magnetic free layer 160.

In some embodiments, the high concentration of boron in the boron-containing encapsulation layer 350 is defined as equal to or higher than the concentration of the boron in the magnetic free layer 160.

In some embodiments, the encapsulation layer 350 is made of substantially pure boron, as is defined in more detail below.

In some embodiments, the encapsulation layer 350 is made of a dielectric material with a boron content of 40% or more. For example, the free layer 160 made of CoFeB 160 has a boron concentration of between 20-30% (e.g., atomic percent) of boron. A boron-containing encapsulation layer 350 embodiment made of boron nitride (BN), has an atomic percent of boron of 50% and an atomic percent of nitrogen of 50%. Therefore, the boron-containing encapsulation layer 350 has an equal to or higher than concentration of boron than the magnetic free layer 160 (as measured in atomic percent).

Atomic percent of a substance can be measured by a transmission electron microscope (TEM) with electron energy loss spectroscopy (EELS) capabilities and/or other known techniques. Atomic percent is the percentage of one kind of atom relative to the total number of atoms in a substance.

Figure 3A:
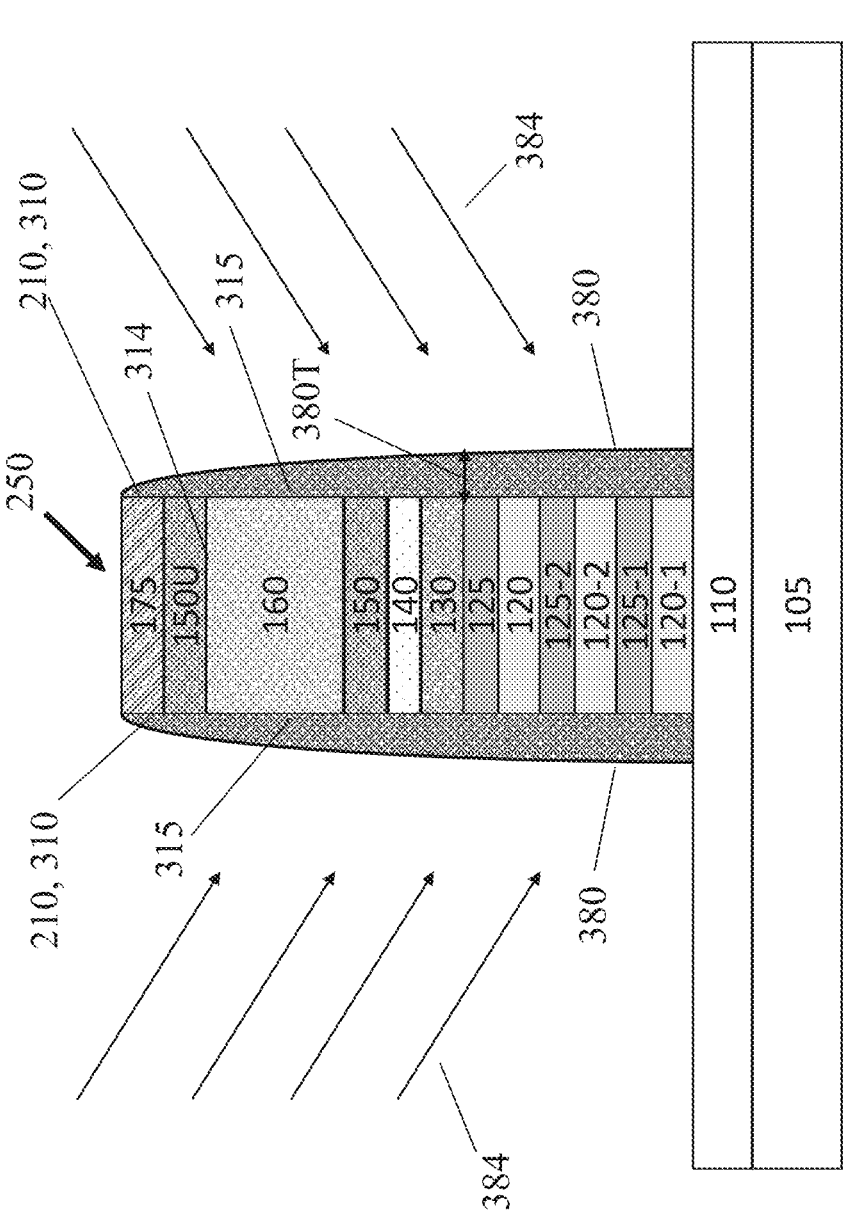
FIG. 3A is a cross-sectional view of one embodiment of a MTJ pillar encapsulated by a dielectric encapsulation layer/spacer that is doped with boron.

FIG. 3A is a cross-sectional view of one embodiment 375 of a MTJ pillar 250 encapsulated by a boron-containing dielectric encapsulation layer/spacer 380. In this embodiment, the dielectric spacer or first dielectric spacer 380, initially may or may not contain boron but in preferred embodiments, the first dielectric spacer 380 initially contains some boron. In some embodiments, the first dielectric spacer 380 is made of SiBCN and is doped 384 with additional boron.

The first dielectric spacer 380 is deposited by known methods, as described above, to a thickness 380T between 1 and 10 nm, or more preferably between 3 and 6 nm. In some preferred embodiments, the thickness 380T of the first dielectric spacer 380 is kept thin to keep the volume of the first dielectric spacer 380 smaller so that less boron implantation is needed to increase the boron concentration of the first dielectric spacer 380.

In some embodiments, the doping 384 is performed by an ion implantation of boron 384, e.g., using either a B or $BF_2$ species, at a low energy and a high dose implant rate. In a preferred embodiment, the implanted boron is added as excess boron to the first dielectric spacer 380 stoichiometrically and/or interstitially.

Using this method, the implanted boron 384 will go into the first dielectric spacer 380, but not into the metal layers (e.g., magnetic free layer 160) of the MTJ pillar 250. Much higher energies are needed for the implanted boron 384 to penetrate into the metal layers, e.g., magnetic free layer 160. Therefore, most of the implanted boron 384 will be implanted within the first dielectric spacer 380 and/or will accumulate within the first dielectric spacer 380 at the boron diffusion interface 315 between the pillar 250 and the first dielectric spacer 380.

In an alternative embodiment, a second dielectric spacer 395 is formed to encompass the first dielectric spacer 380, as described below in the description of FIG. 3B.

Figure 3B:
FIG. 3B is a cross-sectional view of one embodiment of a MTJ pillar encapsulated by a boron containing dielectric further encapsulated by a second dielectric spacer.

FIG. 3B is a cross-sectional view of one embodiment 390 of a MTJ pillar 250 encapsulated by a boron containing dielectric 380 further encapsulated by a second dielectric spacer 395. The second dielectric spacer 395 is deposited on the doped structure 375 described in FIG. 3A by known methods, e.g., CVD followed by a RIE. The second dielectric spacer 395 has a thickness 395T between 5 nm and 50 nm and more preferably between 10 nm and 25 nm.

The second dielectric spacer 395 may or may not contain boron. In some preferred embodiments, the second dielectric spacer 395 in this "dual spacer/layer scheme" contains no boron and is made from SiN.

Figure 4:
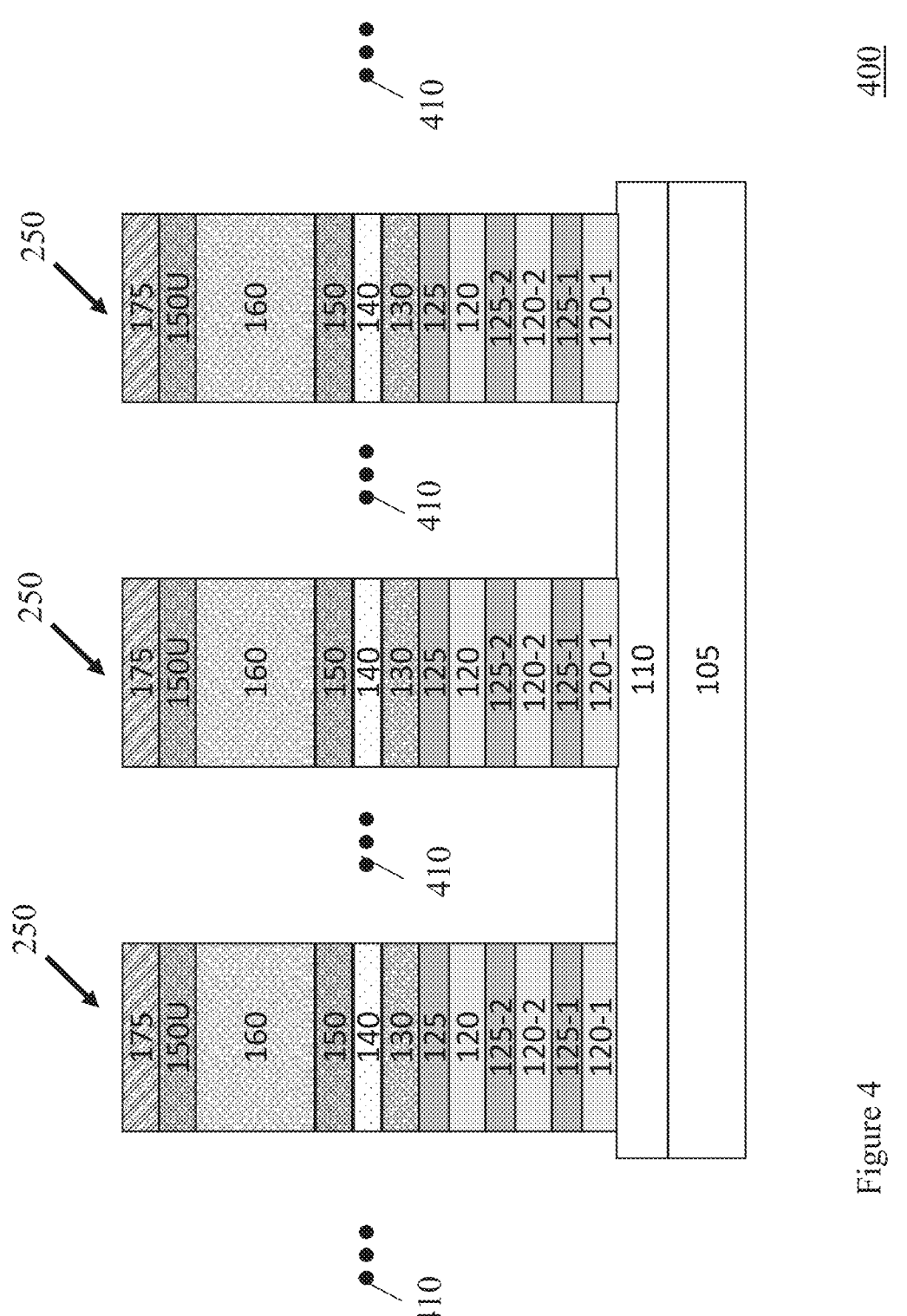
FIG. 4 is a cross-sectional view of an array of MTJ pillars on a substrate.

FIG. 4 is a cross-sectional view of an array 400 of MTJ pillars 250 on a substrate 105. The array 400 was created from the MTJ stacked structure 100 using the masked 225 patterned etch 275 techniques described above, e.g., in FIG. 2. Using these known techniques, arrays 400 of MTJ pillars 250 can be created extending 410 in both directions of the plane of the substrate/FEOL/BEOL layers 105/110.

FIG. 5 is a cross-sectional view of an interim structure 500 for forming an embodiment of a boron-containing encapsulation layer 550 encompassing each of a plurality of MTJ pillars, typically 250 in an array 500 of MTJ pillars 250 on a substrate 105 and FEOL/BEOL layer 110.

In this embodiment, the boron-containing layer 550 is a dielectric material containing boron that is deposited on the MTJ pillars 250 in the array 500 of MTJ pillars 250. The boron-containing layer 550 has a thickness 550T in the range of 5 nm to 100 nm, although other ranges of thickness are contemplated. (See also the description of FIG. 6 below.)

Other embodiments of the boron-containing layer 550 are envisioned. For example, the boron-containing layer 550, can comprise a "dual spacer/layer scheme", where a boron containing spacer, e.g., of 10-20 nm thickness (preferably 10 nm of thickness) that is covered/encompassed by a second dielectric spacer (layer), e.g., made from SiN. See the description of FIGS. 3B and 8.

After the boron-containing layer 550 is formed, e.g., by known methods like chemical vapor deposition (CVD), a known directional etch 575, like a reactive ion etch (RIE) 575, is applied that primarily and selectively removes material that is in the boron-containing layer(s) 550 on the horizontal surfaces, typically 576/577. Minimal material is removed from the boron-containing layer 550 on the vertical surfaces, typically 578.

FIG. 6 is cross-sectional view of an array 600 of MTJ pillars 250 each encompassed by a boron-containing encapsulation layer 350/650 in a boron-containing dielectric encapsulation layer embodiment, showing a "single spacer/layer scheme". The slight "rounding", typically 651, at the top of the boron-containing encapsulation layer 350/650, is due to the minimal removal of material during RIE processing. Some minor amount of material is removed from the vertical sides of the boron-containing deposition layer.

The boron-containing dielectric encapsulation layers 350/650, in one embodiment, are made from the steps and structures described in FIGS. 4 and 5.

The boron-containing dielectric encapsulation layer 350/650 has a boron concentration as those previously described. Other boron concentrations are contemplated.

The boron-containing dielectric encapsulation layer 350/650 encapsulates the whole pillar 250 including the magnetic free layer 160 external surfaces 215 at the boron diffusion interface 315 between the magnetic free layer 160 external surfaces 215 and the boron-containing encapsulation layer 350/650.

Figure 7:
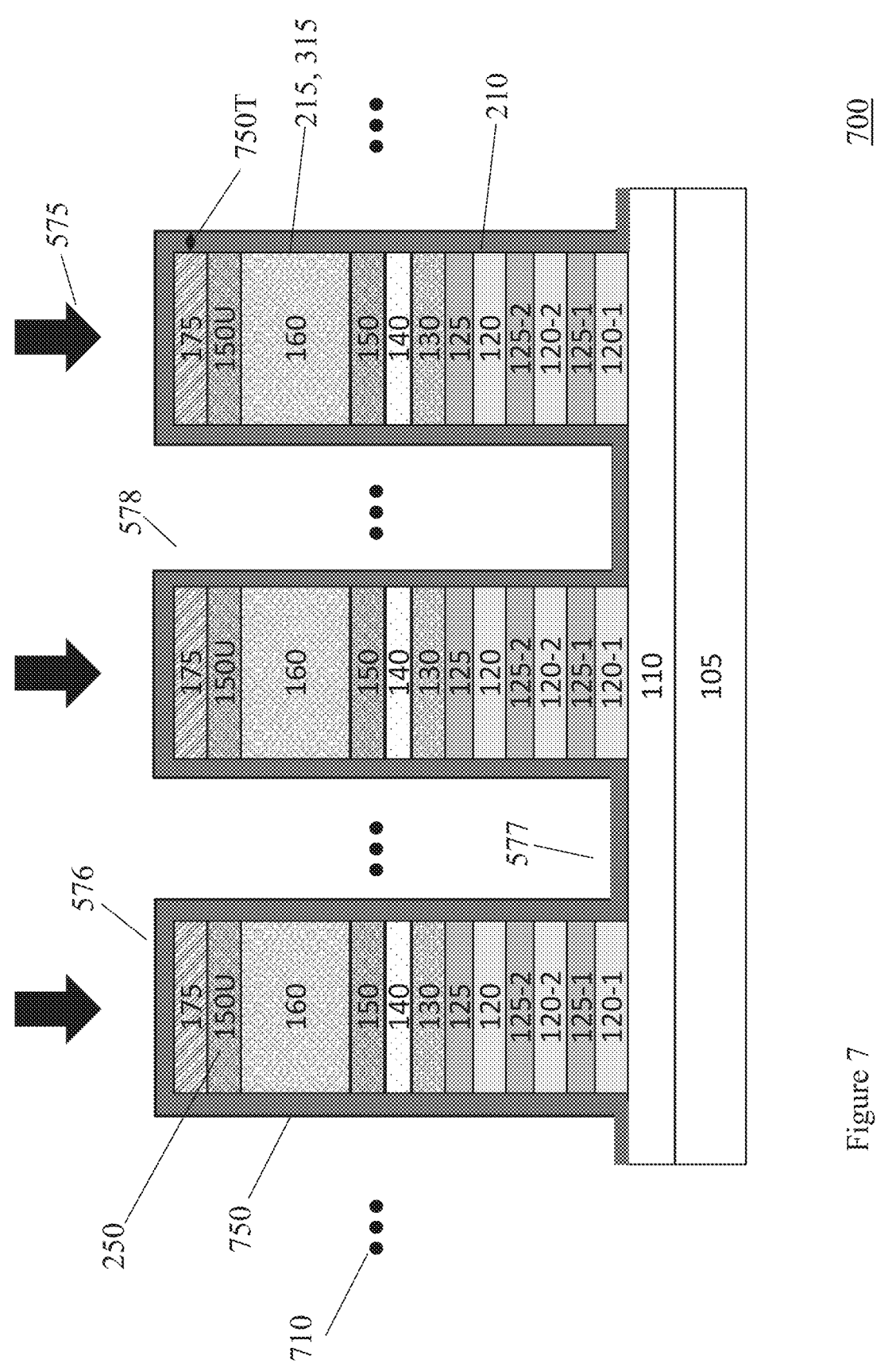
FIG. 7 is cross-sectional view of an interim structure of an array of MTJ pillars each encompassed by one preferred embodiment of a substantially pure boron encapsulation layer.

FIG. 7 is cross-sectional view of an interim structure of an array 700 of MTJ pillars 250 each encompassed by one embodiment of a boron-containing encapsulation layer 750 that is layer of pure boron 750. In some embodiments, the boron layer 750 is between 1 and 3 nm thick 750T and the boron layer 750 encapsulates the sides MTJ pillar surfaces 210, specifically encapsulating the magnetic free layer 160 external surfaces 215 at the boron diffusion interface 315.

To create a structure 700, where the boron-containing encapsulation layer 750 is a layer of substantially pure boron 750, a structure of one or more MTJ pillars 250 on a substrate 105, similar to structure 400, is exposed to borane ($BH_3$). Borane ($BH_3$), a gas, typically exists in dimer form, forming Diborane ($B_2H_6$).

The Diborane gas mixture may be a commonly delivered "borane" with a concentration of 1-5% borane ($BH_3$) in a hydrogen carrier gas. Uses of higher diborane concentrations or 100% diborane are also contemplated. In some embodiments, before entering the CVD reactor/process chamber, the borane gas may be diluted more with additional hydrogen with a dilution network.

As a non-limiting example, a structure 400, with one or more MTJ pillars 250 disposed on a substrate 105, is placed in a low-pressure chemical vapor deposition (LPCVD) reactor.

A diborane gas containing mixture is flown into the CVD reactor. The apparatus is at process temperature while the process gas is flown. The structure 400 is heated by rapid thermal annealing (RTA), e.g., by placing the structure 400 in a quartz glass epitaxial reactor, which is RTA lamp heated. In some embodiments, the LPCVD reactor/chamber is at a temperature of between 250 and 400 Celsius (C) at a pressure of 0.1-10 torr.

Under above conditions the diborane pyrolysis in the gas phase, polymerizes and over various stages forms higher boranes like $B_4H_{10}$, $B_5H_{11}$, $B_5H_9$, until decaborane ($B_{10}H_{14}$), as a most stable final product, is formed. Higher boranes like $B_{20}H_{26}$ might be formed in trace amounts.

These higher boranes are precursors to the pure boron layer 750 and temporarily occupy the space designated by the pure boron layer 750 in FIG. 7. The higher boranes decompose as explained below and become the pure boron layer 750 in the final structure 700. In other words, layer 750 in FIG. 7 shows a pure boron layer after the intermediate, higher boranes are deposited and decompose.

In one example embodiment, the precursor higher borane layer (occupying the space of layer 750) is made at process conditions with a temperature of 400° C. at 10 torr for between approximately 100 seconds to 1000 seconds.

An alternative embodiment for making the precursor higher borane layer is slower and better controlled for sidewall/surface 210 coverage. This method results in an ultimate 1-3 nm thickness 750T of the pure boron layer 750 embodiment, after decomposition of the precursor higher borane layer deposited. In this process embodiment, a 26 standard liter per minute (slm) hydrogen flow is flown into the LPCVD reactor with a borane concentration (partial pressure) at $5\times10^{-4}$ to $1\times10^{-2}$ mtorr with a flow of 0.2-3 standard cubic centimeter per minute (sccm) of 1% diborane diluted in hydrogen, and that corresponds to 0.002-0.03 sccm pure $B_2H_6$, which is equivalent to 0.08-1.14 ppm pure $B_2H_6$ in the gas mixture. It is noted that the final pure boron layer 750 (and layer 850 in FIG. 8) is thin 750T in preferred embodiments. In some embodiments, the pure boron layer 750/850 is between 1 and 3 nm thick, although other thickness are contemplated. (What is meant by "pure" boron is described below.)

We have found that by using the process disclosed above, a slow deposition of higher boranes enables a deposition of a thin layer of a mixture of these higher boranes. The higher boranes in this deposited mixture include: $B_4H_{10}$, $B_5H_{11}$, $B_5H_9$, and $B_{10}H_{14}$. As the higher boranes decompose into boron, the layer composition becomes pure boron 750/850. Therefore, by using the techniques above, a precursor layer of boranes can be deposited slowly and precisely to a controlled thickness which will decompose (lose hydrogen) in a predictable way to form a thin pure boron layer 750/850 within a tight tolerance that encompasses the MTJ pillars 250, and in particular, encompass the magnetic free layer 160 external surfaces 215 at the boron diffusion interface 315.

As a further example, in some embodiments, decaborane, as well as intermediate compounds like pentaborane, ($B_5H_9$), hexaboranes ($B_6H_{10}$, and $B_6H_{12}$), and other higher boranes form on the sidewalls/surface 210 of the MTJ pillars 250.

The higher boranes are not very stable and decompose on the (metallic) surface 210/215 or later during processing, e.g., while adding the dielectric spacer 875 as described in FIG. 8. After the deposition and decomposition, "pure boron" remains on the surfaces 210/215 while any hydrogen diffuses into ambient and/or into the spacer 875. Note that while the remaining "pure boron" layer 850 may have small traces (virtually undetectable) of hydrogen, the layers 750/850 are essentially made of pure boron and are referred to as containing pure boron.

Note that since the concentration of boron in the substantially pure boron-containing encapsulation layer 750 in this embodiment can be as high 100% (or essentially 100%), boron diffusion through the boron diffusion interface 315 out of the magnetic free layer 160 is nearly or entirely eliminated. (The substantially pure boron-containing encapsulation layer 750 is made of at least 95%, more preferably 99%, boron.) However, diffusion of boron through the boron diffusion interface 315 into the magnetic free layer 160 from the boron encapsulation layer 750 is limited by the boron solubility of boron in the material making up the magnetic free layer 160.

Figure 8:
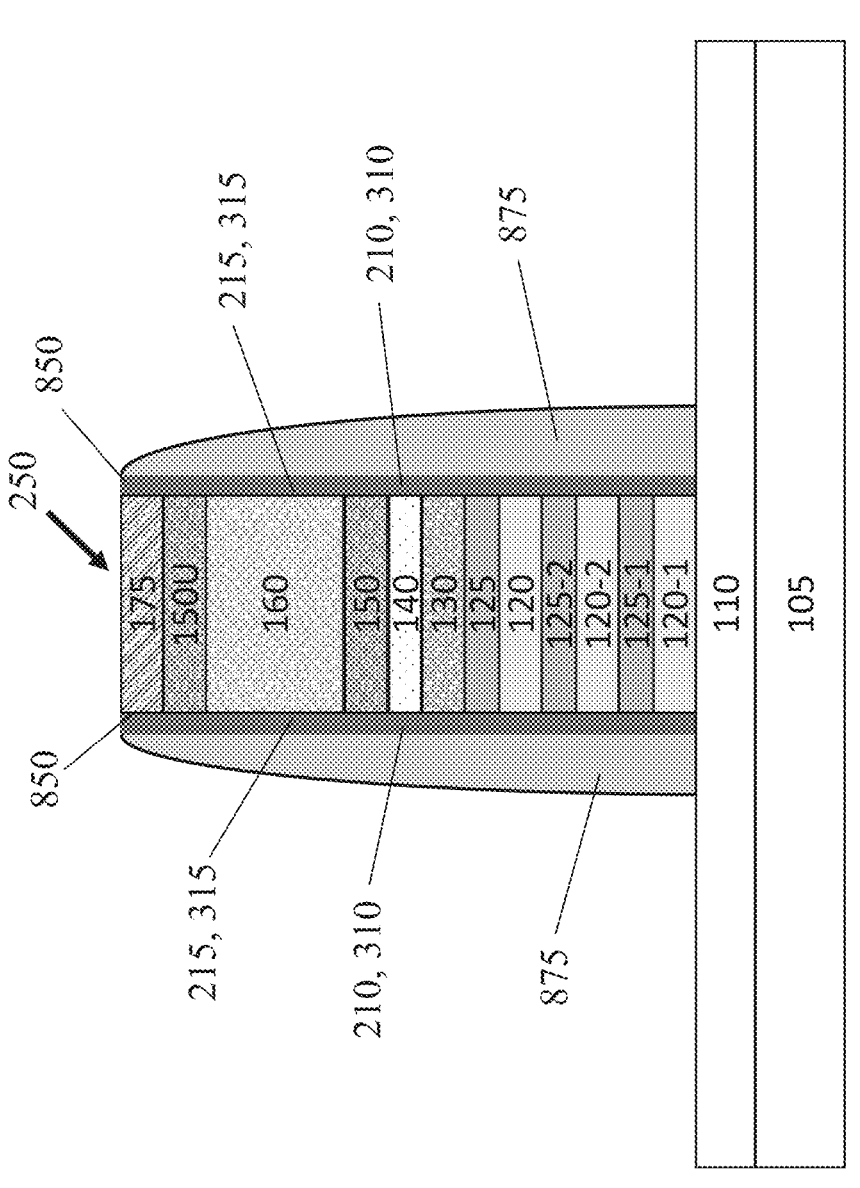
FIG. 8 is a cross-sectional view of the one of the MTJ pillars of the embodiment shown in FIG. 7 where the substantially pure boron encapsulation layer is encompassed by a dielectric spacer.

FIG. 8 is a cross-sectional view of one example of a MTJ pillar 250/800 of the embodiment shown in FIG. 7 with the boron-containing encapsulation layer 750 where the boron-containing layer is a layer of substantially pure boron 850, like that 750 in FIG. 7, that is encompassed by a dielectric spacer 875. In some embodiments, the example MTJ pillar 800 can be one of an array of MTJ pillars 800 encapsulated by a layer of substantially pure boron 850 and further encapsulated/encompassed by a dielectric spacer 875.

The dielectric spacer 875 is formed much like the boron-containing dielectric encapsulation layer 350 described above. However, while the dielectric spacer 350 contains boron, the dielectric spacer 875 may or may not contain boron.

In some embodiments of structure 800, the structure of an array 700 of MTJ pillars 250 is covered by a layer of dielectric made of the material used in the dielectric spacer 875. Example materials used for the dielectric spacer 875 include "low-k dielectric," electrically insulating material having a dielectric constant less than silicon dioxide, e.g., less than 3.9. Exemplary low-k dielectric materials include, but are not limited to, dielectric nitrides (e.g., SiN, SiBCN), dielectric oxynitrides (e.g., SiOCN, SiCO), or any combination thereof or the like. The dielectric spacer 875 layer is deposited on the layer of boron 850 by known processes, like ALD, PVD, CVD, or sputtering to a thickness between 5 to 50 nm. Similar to the process described in FIG. 7, a known directional etch is applied that primarily and selectively removes material (spacer material and the boron layer 850) on the horizontal surfaces, leaving the dielectric spacer 875 encapsulating the pure boron layer 850 and the MTJ pillar 250 surfaces 210, and in 0 particular the magnetic free layer 160 external surfaces 215 and boron diffusion interfaces 315.

In some embodiments, the dielectric spacer 875 is made of SiBCN, SiOCN, SiBN, SiON, SiON, or SiN.

Figure 9:
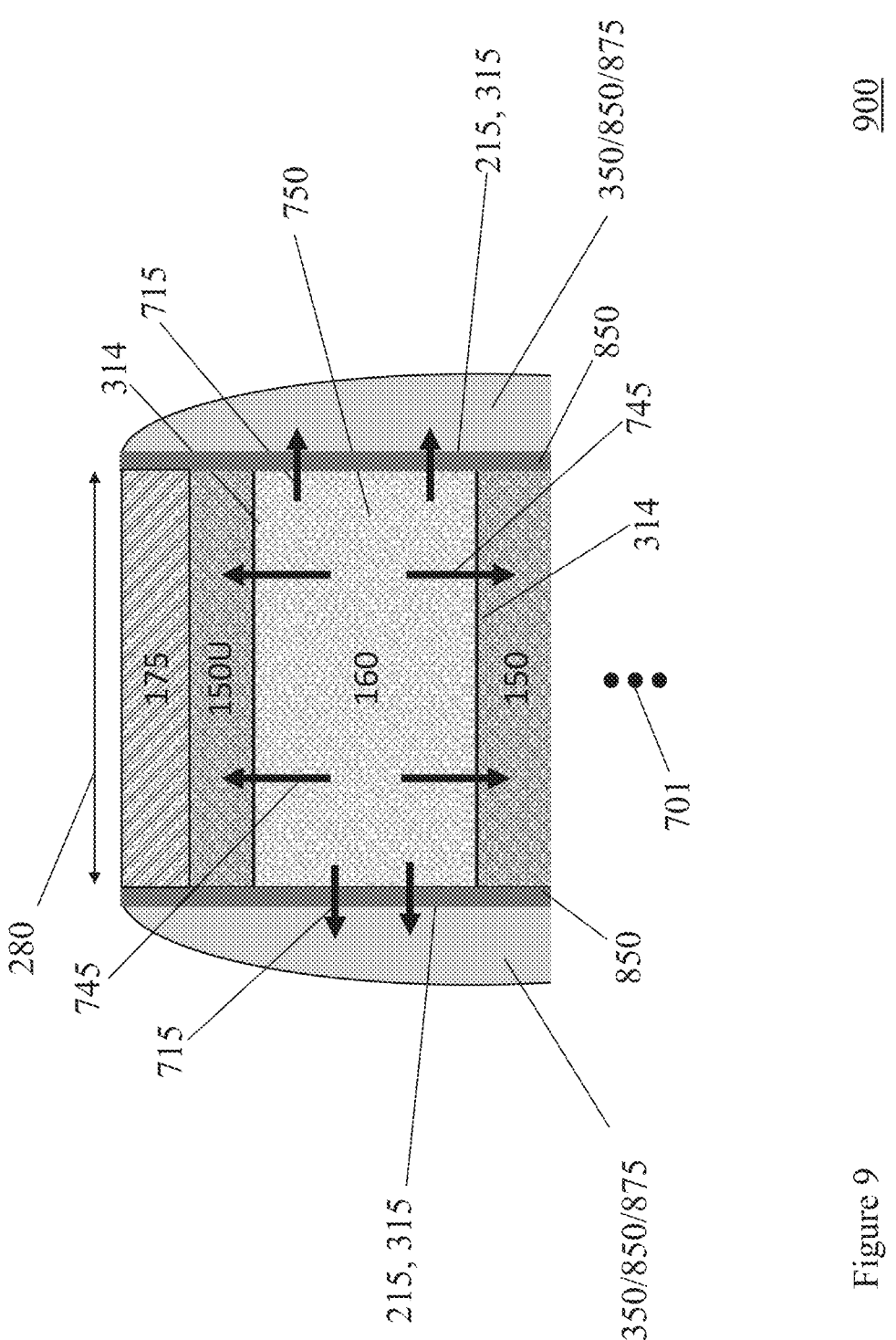
FIG. 9 is a drawing showing part of the MTJ pillar including interfaces between a boron-containing encapsulation layer (1. a boron-containing dielectric layer or 2. a preferred substantially pure or pure boron layer) and a MTJ pillar magnetic free layer, the interfaces being at the external surfaces of the MTJ pillar magnetic free layer.

FIG. 9 is a drawing showing part 701 of an example MTJ pillar 250 and showing more detail of the magnetic free layer 160. The magnetic free layer 160 has internal interfaces 314 in direct contact with internal MTJ pillar 250 layers like the tunnel barrier layer 150 or capping layer 175. Internal interfaces 314 are interfaces, typically a bottom and a top internal interface, of the magnetic free layer 160 entirely facing within the MTJ pillar 250. The magnetic free layer 160 also has magnetic free layer 160 surfaces 215 or magnetic free layer 160 external surfaces 215 that are not internal to the MTJ pillar 250 but are collinear to the MTJ pillar surfaces 210. The boron diffusion interface 315 is the interface at the magnetic free layer external surfaces 215 and is between the magnetic free layer 160 and the boron-containing encapsulation layer (either 350, 380, or 850 or 850/875) where there is direct contact between the magnetic free layer external surfaces 215 and the boron-containing encapsulation layer 350/380/850.

Note that alternative embodiments of the boron-containing dielectric layer are shown/implied in FIG. 9. Non-limiting implied embodiments of the boron-containing encapsulation layer 350/850 include: 1. a boron-containing encapsulation layer 350, e.g., where the boron is contained in a material like a dielectric; 2. a boron encapsulation layer of substantially pure boron 850 encapsulated by an encapsulating dielectric spacer 875, and 3. a boron-doped, boron-containing encapsulation layer 380. Other embodiments include encompassing items 1 and 3 with a second dielectric spacer 395, e.g., in a dual spacer/layer scheme. The boron-containing encapsulation layer 350/380/850 is in direct contact with the magnetic free layer 160 MTJ pillar surfaces 215 and forms a boron concentration difference across the diffusion interface 315 at the external surfaces 215. Any of these embodiments can encompass a layer of substantially pure boron 850 which is direct contact with the magnetic free layer 160 MTJ pillar surfaces 215.

Again, the concentration of boron, e.g., by atomic percent, in the boron-contain encapsulation layer 350/850 is equal to or greater than the atomic percent of boron in the magnetic free layer 160. These boron-containing encapsulation layers 350/850 enable structural and performance improvements for the magnetic free layer 160.

Due to the encapsulation layers 350/850, potential improvements in magnetic free layer 160 include:

1. A magnetic free layer 160 range of He between 500 Oe and 5,000 Oe and a range of HK between 2000 Oe to 20,000 Oe.

2. A magnetic free layer 160 magnetic moment, Ms·t, in the approximate range of 0.1-0.25 memu/cm2. The Ms t is typically measured for blanket films 160 (and not in devices) and can be measured by magnetometry methods like VSM (vibrating sample magnetometer) or SQUID (super conducting quantum interference device).

3. Manufacturing yield related to particle contamination is reduced because particle contamination over time per structure 100 is reduced, as can be measured by standard in-line inspection tools. Reduced particle contamination also increases the mean-time-between preventive maintenance for the deposition chamber tool.

Figure 10:
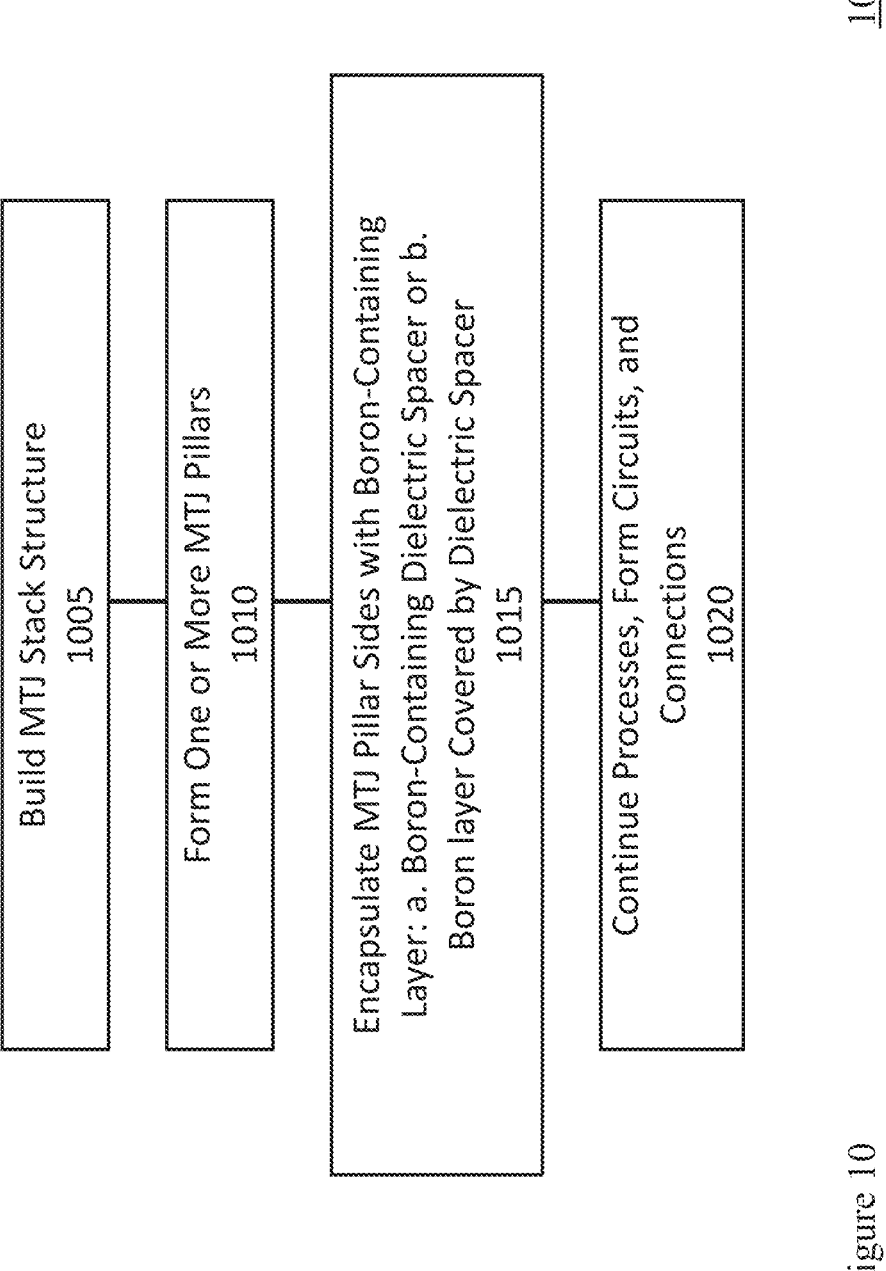
FIG. 10 is a flow chart of a process of making one or more MTJ pillars with a boron-containing encapsulation layer.

FIG. 10 is a flow chart of a process 1000 of making one or more MTJ pillars 250 with a boron-containing encapsulation layer 350/850.

The process 1000 begins with step 1005 by building a MTJ stack structure 100 as described in the description of FIG. 1.

In step 1010, the one or more MTJ pillars 250 are formed as described in the description of FIGS. 2 and 4.

In step 1015, the MTJ pillar 250 surfaces 210 including MTJ pillar magnetic free layer 160 external surfaces 215 are encapsulated by a boron-containing layer, as described above. In one embodiment, the MTJ pillar 250 surfaces 210 are encapsulated by a boron-containing dielectric spacer 350/380 as described in the description of FIGS. 2, 3, 3A, 3B, 4, 5, and 6. In an alternative embodiment, the MTJ pillar 250 surfaces 210 are encapsulated by a pure (or substantially pure) boron layer 850 further encapsulated by a dielectric spacer 875 as described in any of the descriptions of FIGS. 3, 3A, 3B, 6, 8, and 9.

In step 1020, known process steps are performed to connect other circuit components, e.g., in the BEOL 110, to the MTJ pillar(s) to form MTJ devices such as MRAMs, by well-known method steps and using well known structures.

A non-limiting further example of the encapsulation step 1015 is as follows: boron is deposited onto a surface by pyrolysis of Diborane into one or more higher boranes and subsequently decomposing the higher boranes. Note that this method step 1015 can be used to deposit on and/or encapsulate a surface made semiconductor and/or a metal. In some embodiments, the higher boranes include one or more of the following: Tetraborane ($B_4H_{10}$), Pentaboranes ($B_5H_{11}$ and $B_5H_9$), Hexaboranes ($B_6H_{10}$, and $B_6H_{12}$) and Decaborane ($B_{10}H_{14}$). In some embodiments, the higher boranes are formed in a gas phase and then the higher boranes are deposited onto the surface. In some embodiments, the higher boranes decompose into boron and hydrogen.

As stated above, the term "pure boron" means at least 95% and, more preferably, 99% boron, and most preferably 100% pure boron. In addition, embodiments of the invention include 'pure boron" as "substantial pure boron". Substantial pure boron is greater than or equal to 100%-$\Delta$%, where $\Delta$% is the 6-sigma point of the process for forming the 100% boron.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A magnetic tunneling junction (MTJ) pillar disposed on a substrate, wherein the MTJ pillar has one or more MTJ pillar surfaces/sidewalls that are perpendicular to the substrate, and wherein the MTJ pillar comprises:

one or more magnetic reference layers, the magnetic reference layers having a first magnetic orientation, the first magnetic orientation being a fixed magnetic orientation, the magnetic reference layers disposed on the substrate;

one or more magnetic free layers, the magnetic free layers having a second magnetic orientation the second magnetic orientation being switchable to one of a parallel and an anti-parallel alignment with the first magnetic orientation, the magnetic free layers having one or more magnetic free layer external surfaces and one or more internal magnetic free layer interfaces, the magnetic free layers external surfaces being colinear with the MTJ pillar surfaces/sidewalls, the magnetic free layers containing a first atomic percentage amount of boron greater than zero;

a tunnel barrier layer with a tunnel barrier layer thickness, the tunnel barrier layer being sandwiched between the magnetic reference layer and the magnetic free layer; and a boron-containing encapsulation layer encapsulating and in direct contact with the magnetic free layers external surfaces, the boron-containing encapsulation layer containing a dielectric material with a second percentage amount of boron greater than the first atomic percentage amount of boron in the magnetic free layers.

2. The MTJ pillar, as in claim 1, where the boron-containing encapsulation layer is made of substantially pure boron.

3. The MTJ pillar, as in claim 2, where the boron-containing encapsulation layer is between 1 and 3 nanometers (nm) thick.

4. The MTJ pillar, as in claim 2, where the boron-containing encapsulation layer remains on the MTJ pillar surfaces/sidewalls without decomposing.

5. The MTJ pillar, as in claim 2, where the boron-containing encapsulation layer further contains hydrogen.

6. The MTJ pillar, as in claim 2, where diffusion of the boron from the boron-containing encapsulation layer into the magnetic free layers is limited by a solubility of boron in the magnetic free layers.

7. The MTJ pillar, as in claim 2, where the boron-containing encapsulation layer encapsulates all the MTJ pillar surfaces/sidewalls.

8. The MTJ pillar, as in claim 2, where the boron-containing encapsulation layer is encapsulated by a dielectric spacer.

9. The MTJ pillar, as in claim 8, where the dielectric spacer is made from one of the following: SiBCN, SIN, SiOCN, SiBN, SiON, and SiOC.

10. The MTJ pillar, as in claim 1, where the magnetic free layers include at least one material selected from the group consisting of: a magnetic material, a ferromagnetic material, cobalt, iron, alloys of cobalt-iron, nickel, alloys of nickel-iron, alloys of cobalt-iron-boron, and cobalt-iron-boron (CoFeB) alloys.

11. The MTJ pillar, as in claim 1, where the boron-containing encapsulation layer is a dielectric encapsulation layer made of a boron-containing dielectric material.

12. The MTJ pillar, as in claim 11, where the boron-containing dielectric material has a boron content of 40% or more atomic percent.

13. The MTJ pillar, as in claim 11, where the boron-containing dielectric material is boron nitride (BN).

14. The MTJ pillar, as in claim 1, where the boron-containing encapsulation layer is a boron-containing dielectric encapsulation layer made of a boron-containing dielectric material that is encompassed by a second dielectric spacer layer.

15. The MTJ pillar, as in claim 14, where the second dielectric spacer layer is made from one of SiN, SiOCN, or SiBCN.

16. The MTJ pillar, as in claim 1, where the boron-containing encapsulation layer is a dielectric encapsulation layer additionally implanted with boron.

17. The MTJ pillar, as in claim 1, where the boron-containing encapsulation layer is made of 95% boron.

18. The MTJ pillar, as in claim 1, where the boron-containing encapsulation layer is made of at least 99% boron.

19. The MTJ pillar, as in claim 1, where the boron-containing encapsulation layer is pure boron.

20. A structure comprising:

a boron-containing encapsulation layer encapsulating and in direct contact with a surface of a magnetic free layer containing a first atomic percentage amount of boron greater than zero, the boron-containing encapsulation layer containing a dielectric material with a second atomic percentage amount of boron greater than the first atomic percentage amount of boron in the magnetic free layer.

21. The structure, as in claim 20, wherein the structure is a magnetic tunnel junction.

22. A MRAM circuit comprising:

a substrate;

at least one of a front-end-of-the-line (FEOL) layer or a back-end-of-the-line BEOL) layer disposed on the substrate;

one or more MTJ pillars disposed on the at least one of the FEOL layer or the BEOL layer, each of the MTJ pillars comprising: one or more MTJ pillar surfaces/sidewalls, the MTJ pillar surfaces/sidewalls being perpendicular to the substrate and the at least one of the FEOL layer or the BEOL layer;

one or more magnetic reference layers disposed on the at least one of the FEOL layer or the BEOL layer and in electrical contact with one or more BEOL connections in the at least one of the FEOL layer or the BEOL layer, the magnetic reference layers having a first magnetic orientation;

one or more magnetic free layers, the magnetic free layers having a second magnetic orientation, the second magnetic orientation being switchable to one of a parallel and an anti-parallel alignment with the first magnetic orientation, the magnetic free layers having one or more magnetic free layer external surfaces, the magnetic free layers external surfaces being colinear with the MTJ pillar surfaces/sidewalls, the magnetic free layers containing a first atomic percentage amount of boron greater than zero;

a capping layer made of a conductive metal, the capping layer in electrical contact with the magnetic free layers and in electrical contact with one or more capping contacts in the at least one of the FEOL layer or the BEOL layer;

a tunnel barrier layer with a tunnel barrier layer thickness, the tunnel barrier layer being sandwiched between the magnetic reference layers and the magnetic free layers;

and a boron-containing encapsulation layer encapsulating and in direct contact with the magnetic free layers external surfaces, the boron-containing encapsulation layer containing a dielectric material with a second atomic percentage amount of at least 95 percent pure boron and being between 1 and 3 nanometers thick, the second atomic percentage amount of boron of the boron-containing encapsulation layer being greater than the first atomic percentage amount of boron in the magnetic free layers.

23. A method of making a magnetic tunneling junction (MTJ) pillar, comprising the steps of:

forming the MTJ pillar, wherein forming the MTJ pillar comprises:

forming one or more magnetic reference layers, wherein the one or more magnetic reference layers have a first magnetic orientation that is a fixed magnetic orientation;

forming one or more magnetic free layers, wherein the one or more magnetic free layers have a second magnetic orientation that is switchable to one of a parallel and an anti-parallel alignment with the first magnetic orientation, the one or more magnetic free layers having one or more magnetic free layer external surfaces and one or more internal magnetic free layer interfaces, the one or more magnetic free layer external surfaces being colinear with sidewalls of the MTJ pillar, the one or more magnetic free layers containing a first atomic percentage amount of boron greater than zero; and forming a tunnel barrier layer with a tunnel barrier layer thickness, the tunnel barrier layer being sandwiched between the one or more magnetic reference layers and the one or more magnetic free layers; and encapsulating the MTJ pillar with a boron-containing encapsulation layer that encapsulates and is in direct contact with the one or more magnetic free layer external surfaces, the boron-containing encapsulation layer containing a dielectric material with a second atomic percentage amount of boron greater than the first atomic percentage amount of boron in the one or more magnetic free layers.

24. The method, as in claim 23, where the encapsulating step is performed by the steps of:

exposing the MTJ pillar to a borane gas at a temperature of between 250 and 400 Celsius (C) at a pressure of 0.1-10 torr for between 100 and 1000 seconds until one or more higher boranes are formed and deposited on the sidewalls of the MTJ pillar; and decomposing the one or more higher boranes on the sidewalls of the MTJ pillar into the boron-containing encapsulation layer.

25. The method, as in claim 23, where the decomposing step is performed by the steps of:

over the sidewalls of the MTJ pillar, flowing a 26 standard liter per minute (slm) hydrogen flow with a borane concentration partial pressure at $5 \times 10^{-4}$ to $1 \times 10^{-2}$ mtorr with a flow of 0.2-3 standard cubic centimeter per minute (sccm) of 1% diborane diluted in hydrogen.

26. The method, as in claim 25, where the slm hydrogen flow is equivalent to a 0.08-1.14 ppm pure $B_2H_6$ in the gas mixture.

\*   \*   \*   \*   \*